United States Patent [19]

Terada et al.

[11] Patent Number: 5,524,028

[45] Date of Patent: Jun. 4, 1996

[54] DISTRIBUTED PROCESSING DEVICE FOR A DIGITAL FILTER

[75] Inventors: Hiroaki Terada, B-803 Senriichijouike, 3-52 Yamadanishi, Suita-shi, Osaka; Makoto Iwata, Takatsuki; Masayuki Mizuno, Kobe, all of Japan

[73] Assignees: Hiroaki Terada; Mistubishi Denki Kabushiki Kaisha; Sharp Kabushiki Kaisha, all of, Japan

[21] Appl. No.: 116,271

[22] Filed: Sep. 3, 1993

[30] Foreign Application Priority Data

Oct. 9, 1992 [JP] Japan .................................. 4-271668

[51] Int. Cl.[6] ........................... H03H 7/30; H04B 1/10
[52] U.S. Cl. ...................... 375/350; 375/229; 348/399
[58] Field of Search .................................. 348/387, 390, 348/721, 388, 424, 425, 392, 399; 375/103, 12, 39, 38, 350, 261, 229, 230; 358/335; 360/22, 23

[56] References Cited

U.S. PATENT DOCUMENTS 5,111,303  5/1992  Senso et al. ............................ 358/335
5,122,788  6/1992  Sid-Ahmed et al. .................. 348/571
5,245,433  9/1993  Sid-Ahmed et al. .................. 348/571
5,282,226  1/1994  Critchlow ................................ 375/39

OTHER PUBLICATIONS

"The LU Decomposition Theorem and Its Implications to the Realization of Two–Dimensional Digital Filters" By C. L. Nikias et al., IEEE Transaction on ASSP vol. 33 No. 3, Jun. 1985.

"Digital Coding of Waveforms Principles & Applications to Speech and Video", Jayant et al Prentice Hall pp. 604–606.

Primary Examiner—Stephen Chin
Assistant Examiner—Tesfaldet Bocure

[57] ABSTRACT

A horizontal synchronizing signal is counted by a binary counter. A first switch is switched in response to the count value, whereby signal data is classified. A sampling clock signal is counted by a binary counter. An output of the first switch is switched by second and third switches in response to the count value, whereby the data input rate of signal data is reduced. Each classified signal is subjected to filtering by a two-dimensional FIR digital filter.

8 Claims, 4 Drawing Sheets

$P = \text{rank}(\{h(i,j)\})$ $L_K(Z_1) = \sum_{i=0}^{m-1} L_K(i) Z_1^{-i} = Z_1$ DIRECTION ONE-DIMENSIONAL DIGITAL FILTER $U_K(Z_2) = \sum_{j=0}^{n-1} U_K(j) Z_2^{-j} = Z_2$ DIRECTION ONE-DIMENSIONAL DIGITAL FILTER

R = FLOW RATE

DISTRIBUTED PROCESSING DEVICE FOR A DIGITAL FILTER

BACKGROUND OF THE INVENTION

1. Field of the Invention

The present invention relates to a distributed processing device of a digital filter, and more particularly, to a distributed device having a high data input rate, i.e. sampling frequency, in a digital filter widely used in image processing and the like.

2. Description of the Background Art

The processing content of a two-dimensional digital filter is defined by the following equation (1).

$$H(z_1, z_2) = \sum_{i=0}^{m-1} \sum_{j=0}^{n-1} h(i,j) z_1^{-i} z_2^{-j} = \tag{1}$$

$$[1 \; z_2^{-1} \; z_2^{-2} \; \ldots \; z_2^{-n+1}] \begin{bmatrix} h(0,0) & h(1,0) & \ldots & h(m-1,0) \\ h(0,1) & h(1,1) & \ldots & h(m-1,1) \\ h(0,2) & h(1,2) & \ldots & h(m-1,2) \\ \vdots & \vdots & \ddots & \vdots \\ h(0,n-1) & h(1,n-1) & \ldots & h(m-1,n-1) \end{bmatrix} \begin{bmatrix} 1 \\ z_1^{-1} \\ z_1^{-2} \\ \vdots \\ z_1^{-m+1} \end{bmatrix}$$

When a signal data is entered in a raster scan manner, the direction of the raster scan (referred to as "horizontal direction" hereinafter) is represented by $z_1$, and the direction perpendicular to the raster scan direction (referred to as "vertical direction" hereinafter) is represented by $z_2$ in the above equation (1). $z_1^{-1}, z_1^{-2}, \ldots, z_1^{-m+1}$ represent delay of order 1, delay of order 2, ..., delay of order (m−1), respectively, in the horizontal direction. Similarly, $z_2^{-1}, z_2^{-2}, \ldots, z_2^{-n+1}$ represent delay of order 1, delay of order 2, ..., delay of order (n−1), respectively, in the vertical direction. A matrix [h (i, j)] is a coefficient representing the properties of a two-dimensional filter.

A method of decomposing a multidimensional digital filter into low dimensional digital filters of a multistage separable type is disclosed in "The LU Decomposition Theorem and Its Implications to the Realization of Two-Dimensional Digital Filters", IEEE Transactions on ASSP, 33, No. 3, pp. 694–711 (June 1985) by C. L. Nikias, A. P. Chrysafis, and A. N. Venetsanopoulos.

FIG. 6 shows a structure of a two-dimensional digital filter by LU decomposition. If P is the order (or rank ([h (i, j)]) of a matrix [h (i, j)] of equation (1), the two-dimensional digital filter of FIG. 6 includes P one-dimensional digital filters $1_0, 1_1, 1_2, \ldots, 1_{(P-1)}$ in the $z_1$ direction formed of the lower triangular matrix decomposing the matrix [h (i, j)] and P one-dimensional digital filters $2_0, 2_1, 2_2, \ldots, 2_{(P-1)}$ in the $z_2$ direction formed of the upper triangular matrix, connected in series. A signal data is entered in parallel to the one-dimensional digital filters $1_0, 1_1, 1_2, \ldots, 1_{(P-31\;1)}$. The outputs thereof are entered to the two-dimensional digital filters $2_0, 2_1, 2_2, \ldots, 2_{(P-1)}$. The respective outputs are summed up by adders $3_0, 3_1, 3_2, \ldots, 3_{(P-1)}$ to be output.

LU decomposition is specifically indicated in the following equation (2).

$$[1 \; z_2^{-1} \; z_2^{-2}] \begin{bmatrix} 3 & 6 & 3 \\ 1 & 6 & 4 \\ 1 & 2 & 1 \end{bmatrix} \begin{bmatrix} 1 \\ z_1^{-1} \\ z_1^{-2} \end{bmatrix} = \tag{2}$$

$$[1 \; z_2^{-1} \; z_2^{-2}] \begin{bmatrix} 3 & 0 & 0 \\ 1 & 1 & 0 \\ 1 & 0 & 0 \end{bmatrix} \begin{bmatrix} 1 & 2 & 1 \\ 0 & 4 & 3 \\ 0 & 0 & 0 \end{bmatrix} \begin{bmatrix} 1 \\ z_1^{-1} \\ z_1^{-2} \end{bmatrix}$$

In the matrix [h (i, j)] representing the properties of a two-dimensional digital filter, elements 363 of the 0 row are triplicities of elements 121, respectively, of the second row. They are dependent and have the rank of 2. Therefore, the elements in the second column in the lower triangular matrix, and the elements in the second row in the upper triangular matrix are all 0. Therefore, the formation of a two-dimensional digital filter as shown in equation (2) according to LU decomposition results in the structure shown in FIG. 7 where two one-dimensional digital filters are connected serially in the horizontal direction and the vertical direction. Referring to FIG. 7, a one-dimensional digital filter 4 has $[1, z_1^{-1}, z_1^{-2}]$ multiplied by [1, 2, 1], a one-dimensional digital filter 5 has [3, 1, 1] multiplied by $[1, z_2^{-1}, z_2^{-2}]$, a one-dimensional digital filter 6 has [0, 4, 3] multiplied by $[1, z_1^{-1}, z_1^{-2}]$, and a one-dimensional digital filter 7 has [0, 1, 0] multiplied by $[1, z_2^{-1}, z_2^{-2}]$. The outputs of one-dimensional digital filters 5 and 7 are added in an adder 8, whereby an output is obtained.

FIG. 8 shows a hardware structure based on the block diagram of FIG. 7. Referring to FIG. 8, D represents a delay circuit of the $z_1$ direction (horizontal direction). It is formed of a data latch, for example, to store one signal data. 1H represents a delay circuit of the $z_2$ direction (vertical direction). It is formed of a FIFO memory, for example, to store signal data of 1 scan line. The multiplier in one-dimensional digital filter 4 multiplies a coefficient 2 by the output of the delay circuit to calculate $2z_1^{-1}$.

When a two-dimensional digital filter formed by LU decomposition is to be realized on a data driving type processor, the delay circuit D of the horizontal direction can be realized by a generation number operation which is the data identifier in the signal data. The delay circuit 1H of the vertical direction preferably employs an external storage device as a FIFO memory since the amount of data to be stored is great.

FIG. 9 shows a signal processing system using a data driven type processor. Referring to FIG. 9, signal input data sampled in the raster scan direction is input in time series from a data transmission path 27 or 28 to a data driven type processor 21. Data driven type processor 21 has pre-specified procedures stored therein by which processing is carried out. A memory interface 22 receives via a data transmission path 24 an access (reference/update of image memory) request to an image memory 23 from data driven type processor 21. After image memory 23 is accessed via a memory access control line 26, the result is returned to data driven type processor 21 via a data transmission path 25. Following the process of a signal input packet, data driven type processor 21 provides a signal output packet via a data transmission path 29 or 30. Data driven type processor 21 realizes the function of an FIFO memory by writing into image memory 23 input data of the vertical direction delay circuit 1H and reading out the same after elapse of the time of 1 line.

As in the conventional case, a two-dimensional digital filter can be formed with multistages of one-dimensional digital filters connected serially according to LU decomposition. As shown in FIG. 6, assuming that the flow rate (corresponding to sampling frequency) of input data to a two-dimensional digital filter is R, the flow rate of signal data entered to one dimensional digital filters $1_0, 1_1, 1_2, \ldots, 1_{P-1}$ of each horizontal direction is R since the input signal data is copied and entered to one dimensional digital filters $1_0, 1_1, 1_2, \ldots, 1_{(P-1)}$ of the horizontal direction.

Also, because the inputs of one dimensional digital filters $2_0, 2_1, 2_2, \ldots 2_{P-1}$ of the vertical direction are connected to the outputs of one dimensional digital filters $1_0, 1_1, 1_2, \ldots 1_{(P-1)}$ of the horizontal direction, the input flow rate of one-dimensional digital filters $2_0, 2_1, 2_2, \ldots 2_{(P-1)}$ of the vertical direction is also R. Therefore, the maximum input flow rate acceptable by the two-dimensional digital filter is limited to the lowest acceptable input flow rate of the one dimensional digital filters after decomposition. In the case where discrete processors are assigned to each individual one dimensional digital filter, there was a problem that the entire processing ability was limited by the processor to which the filter having the greatest processing amount is assigned to.

SUMMARY OF THE INVENTION

In view of the foregoing, the main object of the present invention is to provide a distributed processing device of a digital filter that can have the input flow rate for each digital filter reduced by classifying signal data input to a two-dimensional digital filter according to a predetermined rule, and then carrying out a separate digital filter process on each classified input signal data.

A distributed processing device of a digital filter according to the present invention can comply with the case where the data input rate, i.e. sampling frequency, to the entire digital filter is high by classifying input signal data according to a predetermined rule, and applying a separate digital filter process on a respective classified output if the data input rate for each digital filter is reduced in advance.

Thus, according to the present invention, the input flow rate for each digital filter can be reduced by classifying input signal data according to a predetermined rule with respect to the digital filter, and then applying a separate digital filter process on each input signal data group which is classified. As a result, the input flow rate, i.e. sampling frequency, with respect to the entire digital filter can be increased, allowing a structure of a digital filter having characteristics of high picture quality.

BRIEF DESCRIPTION OF THE DRAWINGS

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The foregoing and other objects, features, aspects and advantages of the present invention will become more apparent from the following detailed description of the present invention when taken in conjunction with the accompanying drawings, which are given by way of illustration only and thus are not limitative of the present invention, and wherein.

DESCRIPTION OF THE PREFERRED EMBODIMENTS

Figure 1:
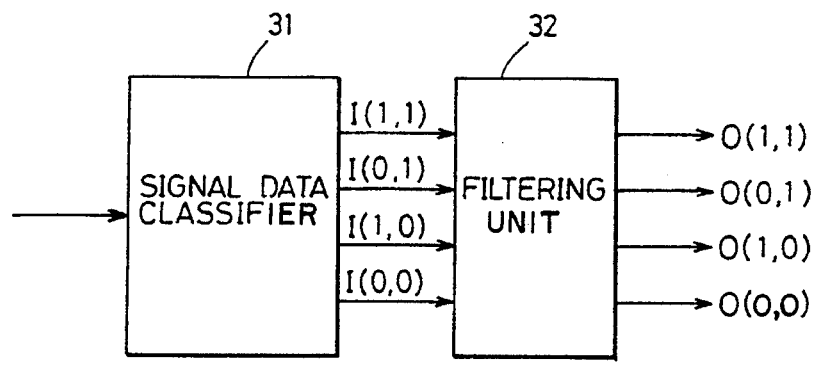
FIG. 1 is a block diagram of an embodiment of the present invention.
Figure 2:
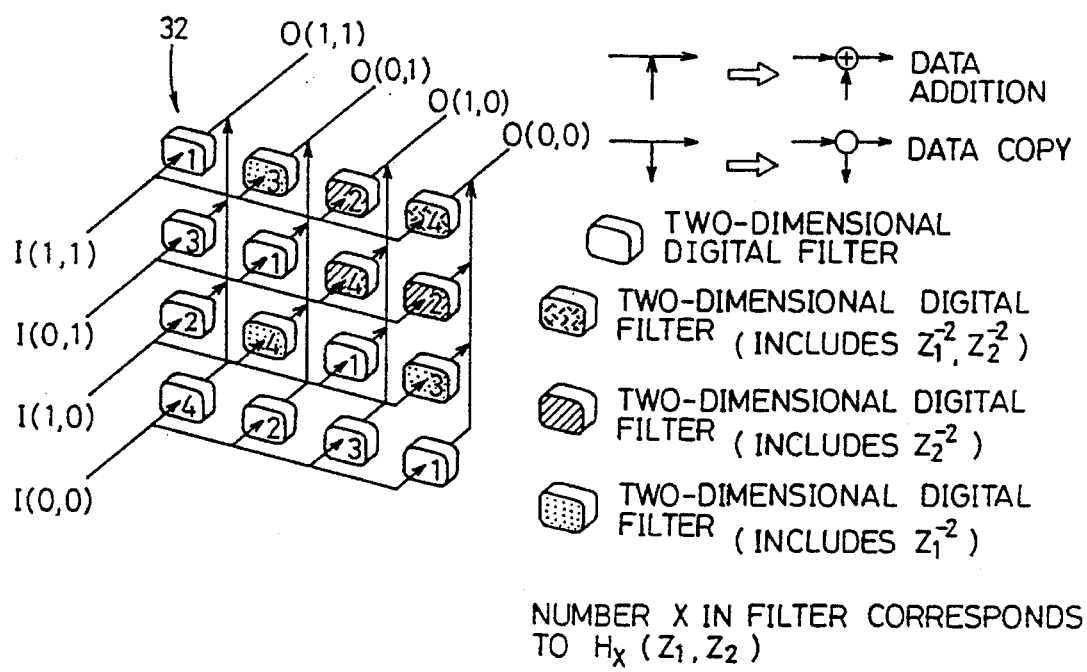
FIG. 2 shows an embodiment of the filtering means of FIG. 1.

Input signal data is classified according to a predetermined pixel position by a signal data classifier 31 shown in FIG. 1, to be provided to a filtering unit 32. Referring to FIG. 2, filtering unit 32 is a matrix of 4 columns and 4 rows in which 16 two-dimensional digital filters (FIR: Finite Impulse Response) are arranged. Each two-dimensional filter is formed by decomposing the two-dimensional digital filter represented by the above-described equation (1) into the 4 two-dimensional digital filters represented by the following equation (3) and combining the same.

$$\left. \begin{array}{l} H_1(z_1, z_2) = \sum_{i=0}^{(m-1)/2} \sum_{j=0}^{(n-1)/2} h(2i, 2j) \, z_1^{-2i} z_2^{-2j} \\ H_2(z_1, z_2) = \sum_{i=0}^{(m-1)/2} \sum_{j=0}^{(n-1)/2} h(2i, 2j+1) \, z_1^{-2i} z_2^{-2j} \\ H_3(z_1, z_2) = \sum_{i=0}^{(m-1)/2} \sum_{j=0}^{(n-1)/2} h(2i+1, 2j) \, z_1^{-2i} z_2^{-2j} \\ H_4(z_1, z_2) = \sum_{i=0}^{(m-1)/2} \sum_{j=0}^{(n-1)/2} h(2i+1, 2j+1) \, z_1^{-2i} z_2^{-2j} \end{array} \right\} \quad (3)$$

The signal data classifier in FIG. 1 shows an embodiment where input signal data is classified for each pixel in both the horizontal and vertical direction. Input data, a sampling clock of signal data, and a horizontal synchronizing signal are entered into signal data classifier 31. A horizontal synchronizing signal is applied when signal data entered in a raster scan format reaches the rightmost pixel and returns to the leftmost pixel of the next row.

Figure 3:
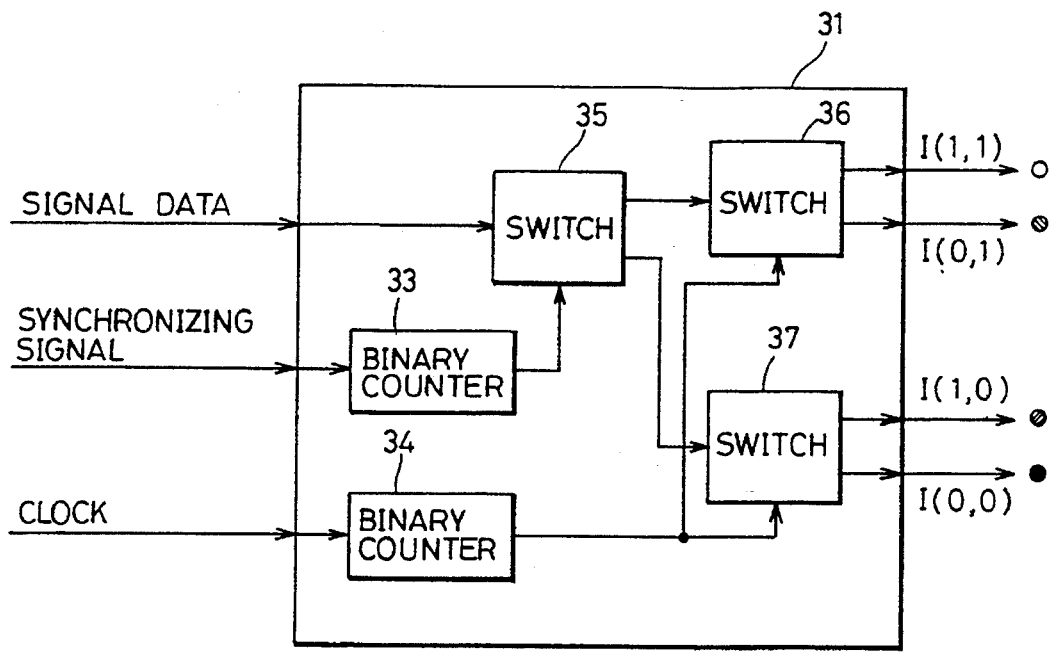
FIG. 3 is a block diagram showing an embodiment of the signal data classifying means of FIG. 1.

Referring to FIG. 3, signal data classifier 31 is formed including binary counters 33 and 34, and switches 35, 36 and 37. The horizontal synchronizing signal is entered into binary counter 33, and the sampling clock is entered into binary counter 34. Switch 35 provides signal data at the lower output terminal and at the upper output terminal when the output value of binary counter 33 is 0 and 1, respectively. Switches 36 and 37 operate similarly according to the output value of binary counter 34.

Figure 4:
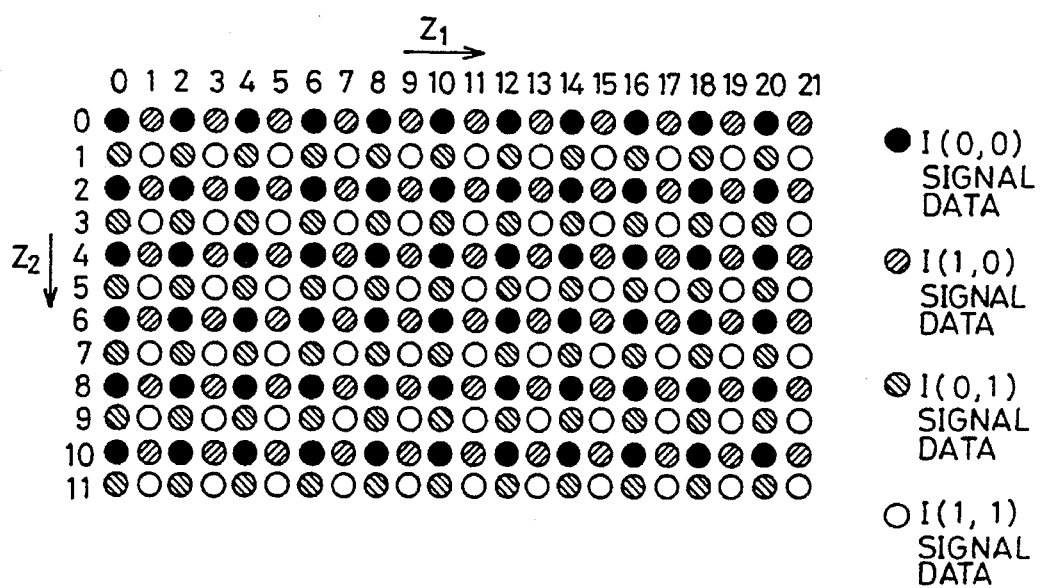
FIG. 4 is a diagram for describing a method of distributing input signal data entered to a two-dimensional digital filter according to an embodiment of the present invention.

FIG. 4 is a diagram for describing a method of distributing input signal data entered into the two-dimensional digital filter of FIG. 2. The signal data of each pixel position shown in FIG. 4 is selectively provided to one corresponding output of the four outputs of signal data classifier 31 of FIG. 3. Although the present embodiment is described in which input signal data is classified by each pixel in both the horizontal and vertical directions, classification can be carried out arbitrarily by appropriately changing the count values of binary counters 33 and 34, and the number of classification of switches 35, 36 and 37.

Signal data having a remainder of 0 with respect to pixel position 2 in the $z_1$ direction (horizontal direction) and a remainder of 0 with respect to pixel position 2 in the $z_2$ direction (vertical direction) in FIG. 4 is entered into input I (0, 0) shown in FIG. 2. Similarly, signal data having a remainder of 1 with respect to pixel position 2 in the $z_1$ direction and a remainder of 0 with respect to pixel position 2 in the $z_2$ direction in FIG. 4 is entered into input I (1, 0) shown in FIG. 2.

To input I (0, 1) in FIG. 2, signal data having a remainder of 0 with respect to pixel position 2 in the $z_1$ direction and a remainder of 1 with respect to pixel position 2 in the $z_2$ direction in FIG. 4 is entered. To input I(1, 1) of FIG. 2, signal data having a remainder of 1 with respect to pixel position 2 of the $z_1$ direction and a remainder of 1 with respect to pixel position 2 in the $z_2$ direction in FIG. 4 is entered. Therefore, the flow rate of the input signal data to the four inputs I (0, 0), I (1, 0), I (0, 1), I (1, 1) shown in FIG. 2 is respectively ¼ of the flow rate of the entire two-dimensional digital filter. Thus, the input flow rate to the digital filter of FIG. 2 becomes ¼ of the flow rate of the entire two-dimensional digital filter. The number denoted in the digital filter shown in FIG. 2 corresponds to the subscripts of the four two-dimensional digital filters $H_1$, $H_2$, $H_3$ and $H_4$ of equation (3), and represents which type of digital filter is used. The hatched portion in each digital filter indicates the further applied delay amount of the filtering result. For example, the hatched digital filter of FIG. 2 implies that a delay of order 2 is applied in the $z_2$ direction of the filtering result.

The branch in the signal path of FIG. 2 implies signal data copy, and the merge of the signal line path implies addition of signal data.

By employing the structure of a digital filter shown in FIG. 2, the input flow rate to this two-dimensional digital filter can be made smaller (¼ in the present embodiment) than the input flow rate to the entire two-dimensional digital filter. Thus, a digital filter is obtained that can comply with signal input having a faster sampling frequency.

Although the embodiment of FIG. 2 employs a distributed processing method of two-dimensional FIR data, this approach has applicability to a two-dimensional IIR (Infinite Impulse Response) filter.

Figure 5:
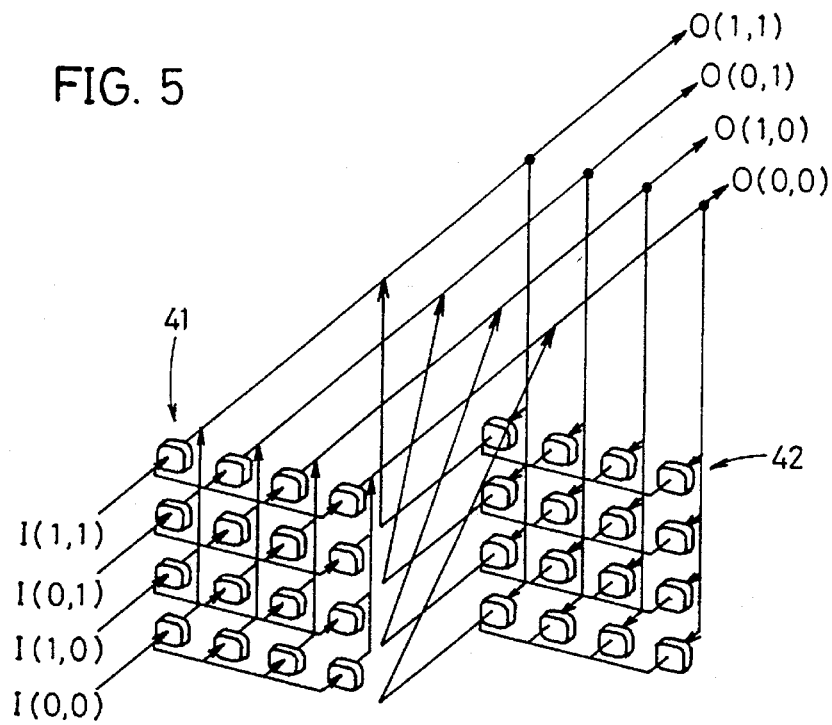
FIG. 5 is a diagram for describing a method of carrying out a distributed process using an IIR filter.
Figure 6:
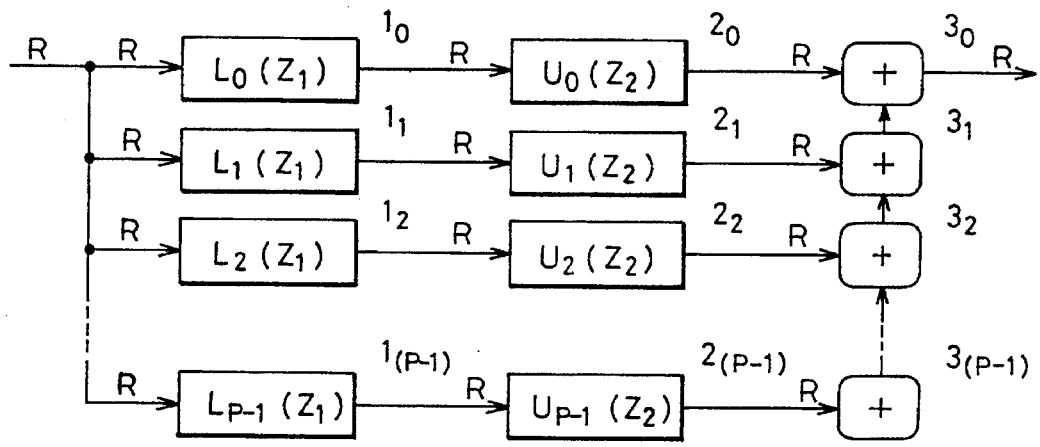
FIG. 6 shows a structure of a conventional two-dimensional digital filter.
Figure 7:
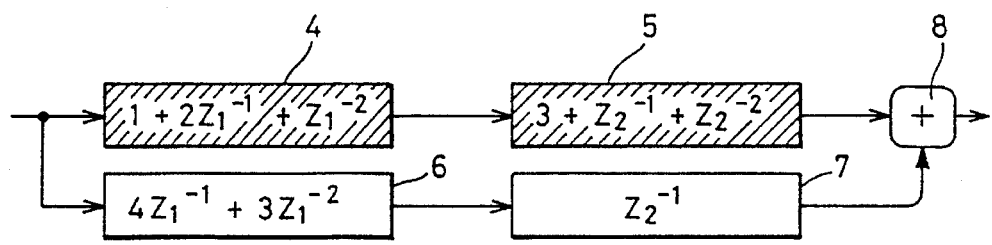
FIG. 7 is a block diagram schematically showing a conventional two-dimensional digital filter.
Figure 8:
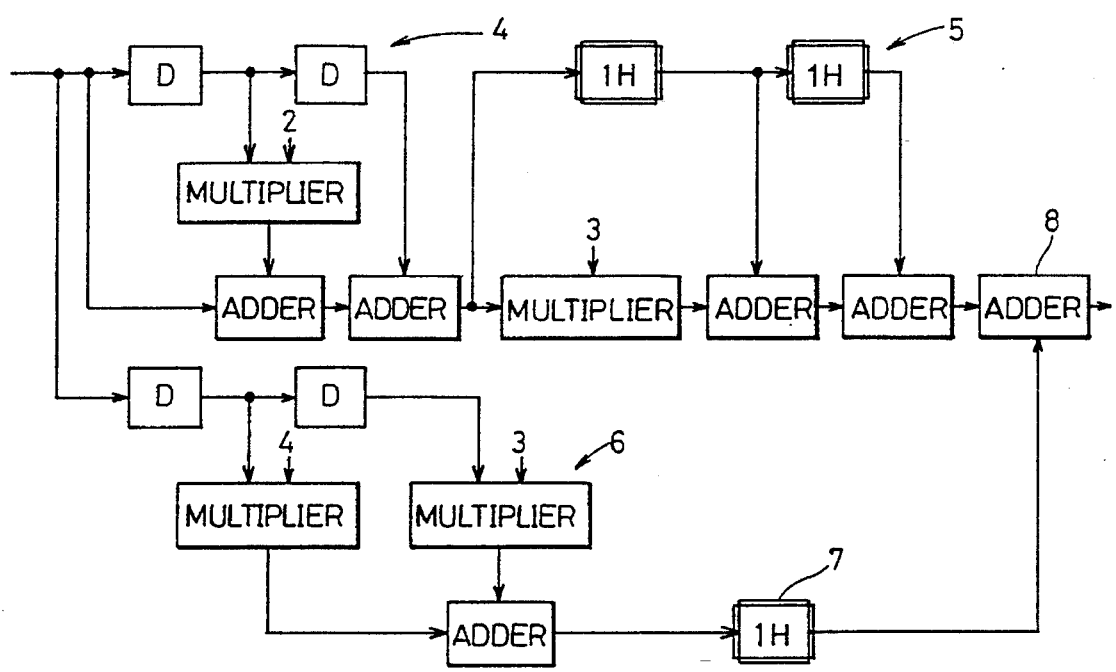
FIG. 8 shows a hardware structure of the two-dimensional digital filter of FIG. 7.
Figure 9:
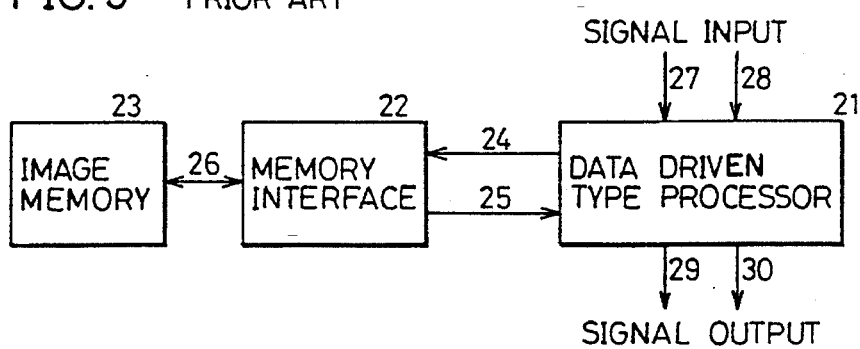
FIG. 9 shows a structure of a signal processing system using a data driven type processor of a conventional case and of an embodiment of the present invention.

FIG. 5 is a diagram for describing a method of carrying out a distributed process using an IIR filter. The IIR filter of FIG. 5 functions to apply classified signal data to a FIR filter 41 of a preceding stage for filtering, whereby the filtered signal data is applied to a FIR filter 42 of a succeeding stage for further filtering, and then fed back.

Although input signal data is classified by every 2 pixels in both the horizontal and vertical directions in the above-described embodiment, the number of classification can be increased. For example, if input signal data is classified for every 3 pixels in the horizontal and vertical directions, the number of inputs to the two-dimensional digital filter becomes 9, whereby the input flow rate to the distributed processed two-dimensional digital filter becomes ⅑. These number of classifications can further be increased if there is margin in the processor resource.

Although the present embodiment was described using a two-dimensional digital filter, the distributed processing method of reducing the input flow rate to each digital filter by classifying input signal data to each digital filter according to a predetermined rule and then carrying separate digital filter process on each input signal data group after classification is also applicable to a one-dimensional digital filter and to a multi-dimensional digital filter greater than dimension 2.

Thus, in accordance with the embodiment of the present invention, the input flow rate of each digital filter can be reduced by classifying input signal data to a digital filter according to a predetermined rule and then carrying out separate digital filter process on each classified group of input signal data. A structure of a digital filter can be achieved having a high input flow rate, i.e, sampling frequency to the entire digital filter with characteristics of higher picture quality.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A distributed processing device for applying distributed processing on a digital filter, comprising:

signal data classifying means for classifying input signal data according to a predetermined rule for reducing a data input rate; and filtering means for carrying out separate digital filtering processes for each output of said signal data classifying means, a sampling clock signal and a horizontal synchronizing signal being input to said signal data classifying means, which comprises first count means for counting said horizontal synchronizing signal, second count means for counting said clock signal, first switching means for classifying and outputting the signal data according to a first count output of said first count means, and second switching means for further classifying the signal data output said first switching means and for outputting the signal data according to a second count output of said second count means.

2. The distributed processing device of a digital filter according to claim 1, wherein said filtering means comprises a plurality of two-dimensional filters arranged in a matrix.

3. The distributed processing device of a digital filter according to claim 2, wherein said two-dimensional filter comprises a two-dimensional FIR filter.

4. The distributed processing device of a digital filter according to claim 2, wherein said two-dimensional filter comprises a two-dimensional IIR filter.

5. A distributed processing method for a digital filter comprising the steps of:

classifying input signal data as plural classified signal data according to a predetermined rule to reduce a data input rate of the signal data; and digitally filtering the plural classified signal data separately, said step of classifying comprising counting an externally provided horizontal synchronizing signal to generate a first count signal, counting an externally provided clock signal to generate a second count signal, switching the input signal data as one of either first or second signal data in accordance with the first count signal, and switching the first signal data as one of either first and second classified signal data and the second signal data as one of either third and fourth classified signal data, in accordance with the second count signal.

6. The distributed processing method for a digital filter of claim 5, wherein said step of digitally filtering comprises filtering the classified signal data with two-dimensional filters arranged in a matrix.

7. The distributed processing method for a digital filter of claim 6, wherein said step of digitally filtering comprises filtering the classified signal data with two-dimensional FIR filters.

8. The distributed processing method for a digital filter of claim 6, wherein said step of digitally filtering comprises filtering the classified signal data with two-dimensional IIR filters.

* * * * *